United States Patent
He et al.

(10) Patent No.: US 12,159,931 B2
(45) Date of Patent: Dec. 3, 2024

(54) NITRIDE-BASED SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Qingyuan He, Suzhou (CN); Ronghui Hao, Suzhou (CN); Fu Chen, Suzhou (CN); Jinhan Zhang, Suzhou (CN); King Yuen Wong, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 17/617,913

(22) PCT Filed: Oct. 22, 2021

(86) PCT No.: PCT/CN2021/125571
§ 371 (c)(1),
(2) Date: Dec. 9, 2021

(87) PCT Pub. No.: WO2023/065284
PCT Pub. Date: Apr. 27, 2023

(65) Prior Publication Data
US 2024/0014305 A1    Jan. 11, 2024

(51) Int. Cl.
*H01L 29/778* (2006.01)
*H01L 29/20* (2006.01)
(Continued)

(52) U.S. Cl.
CPC ...... *H01L 29/7786* (2013.01); *H01L 29/2003* (2013.01); *H01L 29/66462* (2013.01); *H01L 29/872* (2013.01)

(58) Field of Classification Search
CPC ............. H01L 29/7789; H01L 29/2003; H01L 29/66642; H01L 29/872
See application file for complete search history.

(56) References Cited

U.S. PATENT DOCUMENTS

2006/0108606 A1*  5/2006  Saxler ................... H01L 21/318
                                                     257/E29.253
2020/0357909 A1   11/2020  Udrea et al.

FOREIGN PATENT DOCUMENTS

CN          1989601 A       6/2007
CN        101107713 A       1/2008
(Continued)

OTHER PUBLICATIONS

International Search Report and Written Opinion of the corresponding PCT application No. PCT/CN2021/125571 mailed on Jul. 8, 2022.

(Continued)

*Primary Examiner* — Timor Karimy
(74) *Attorney, Agent, or Firm* — Li & Cai Intellectual Property (USA) Office

(57) ABSTRACT

A nitride-based semiconductor device including a first and a second nitride-based semiconductor layers, a source electrode and a drain electrode, and a gate structure. The gate structure includes at least one conductive layer and two or more doped nitride-based semiconductor layers. The at least one conductive layer includes metal, and is in contact with the second nitride-based semiconductor layer to form a metal-semiconductor junction therebetween. The two or more doped nitride-based semiconductor layers are in contact with the second nitride-based semiconductor layer and abut against the conductive layer, so as to form contact interfaces abutting against the metal-semiconductor junction with the second nitride-based semiconductor.

20 Claims, 16 Drawing Sheets

(51) Int. Cl.
*H01L 29/66* (2006.01)
*H01L 29/872* (2006.01)

(56) References Cited

FOREIGN PATENT DOCUMENTS

| CN | 106158948 | A | 11/2016 |
| CN | 113130643 | * | 12/2020 |
| CN | 112310208 | A | 2/2021 |
| CN | 113130643 | A | 7/2021 |
| CN | 113439340 | A | 9/2021 |
| JP | 200959946 | A | 3/2009 |
| WO | 2014204209 | A1 | 12/2014 |

OTHER PUBLICATIONS

First Office Action of corresponding China patent application No. 202180003959.9 mailed on Nov. 11, 2022.

* cited by examiner

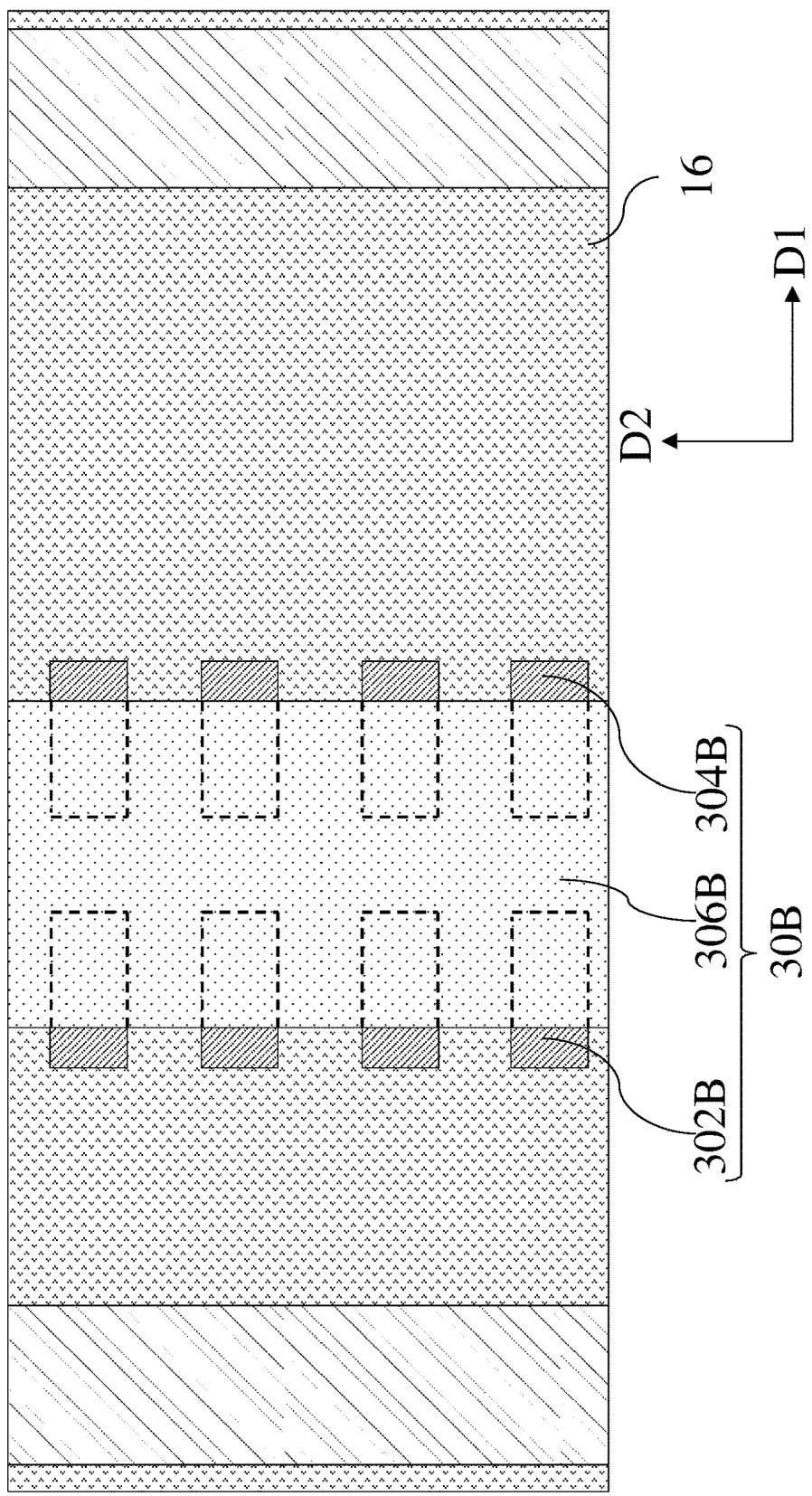

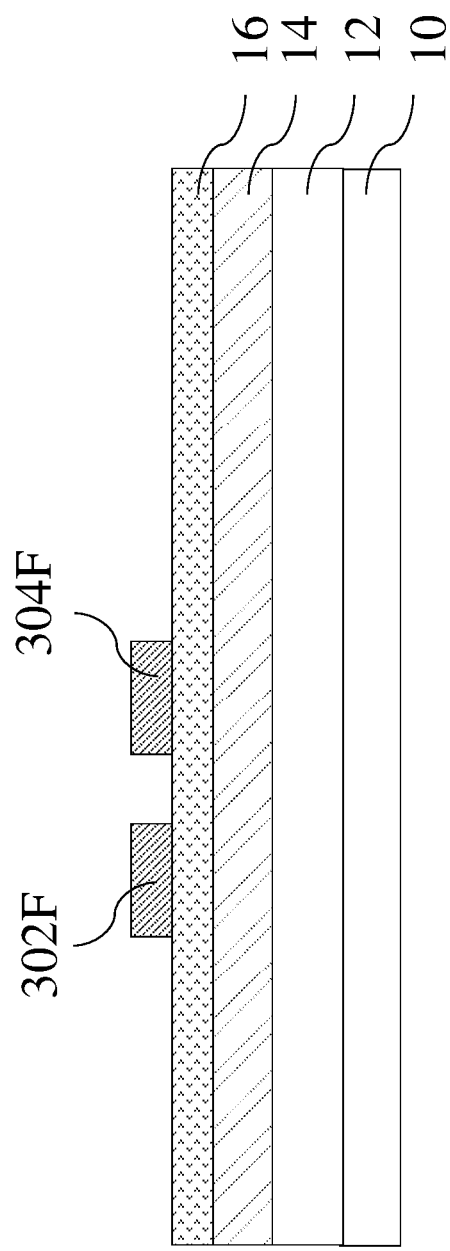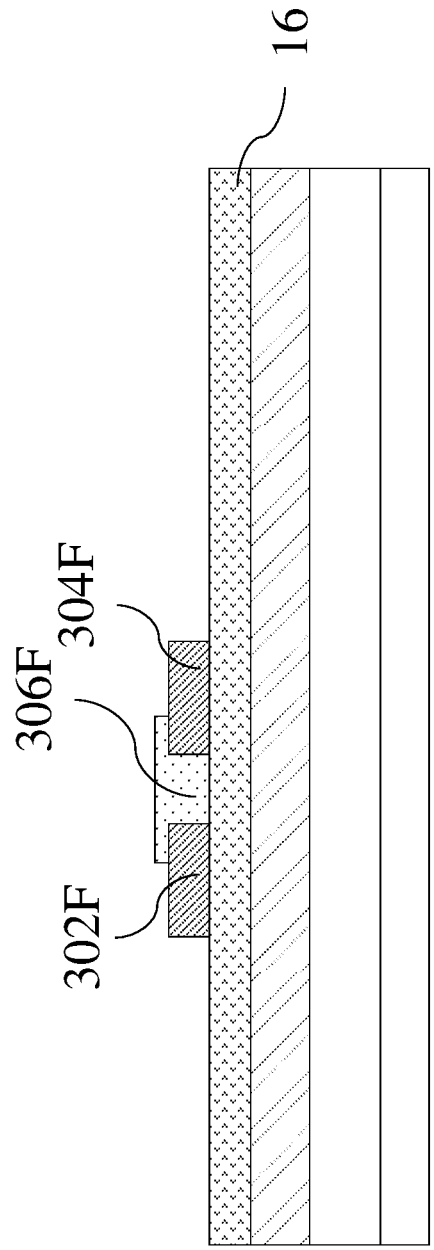

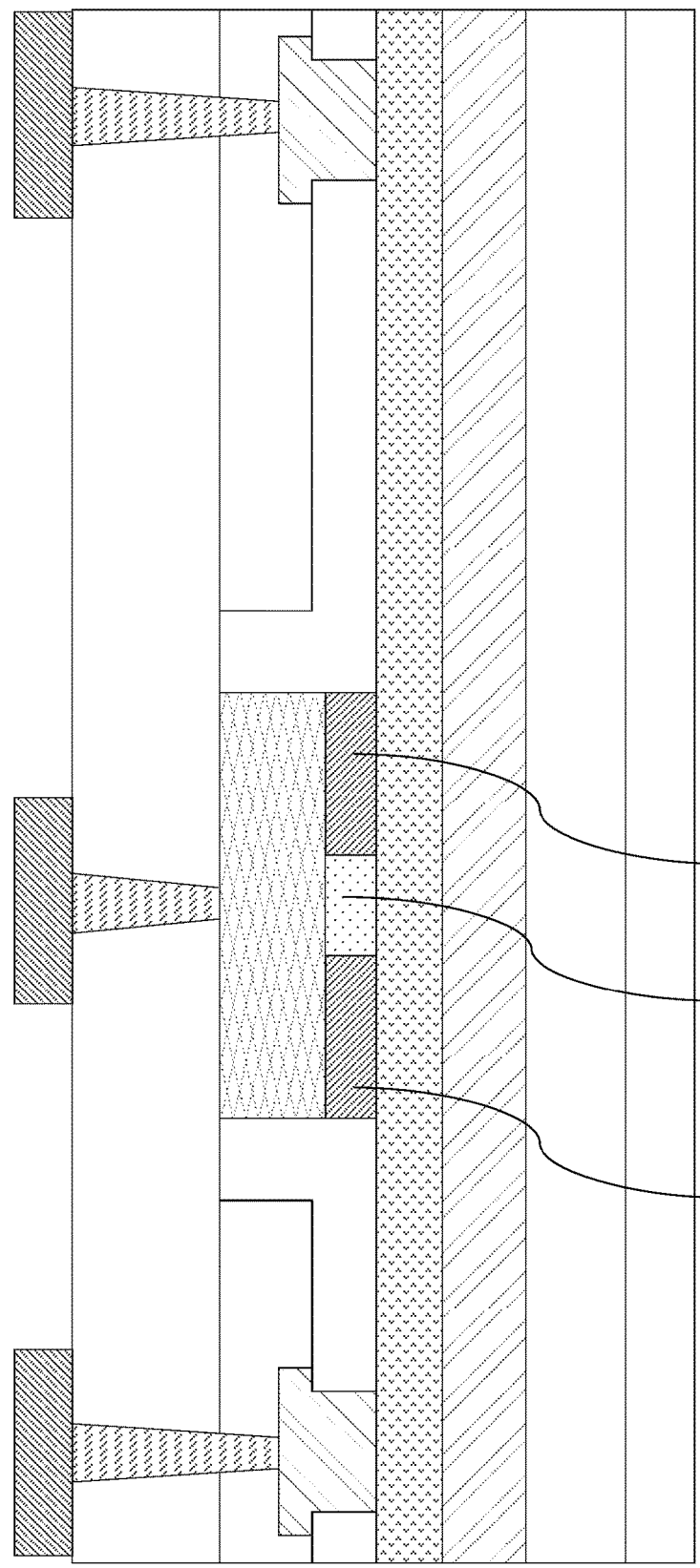

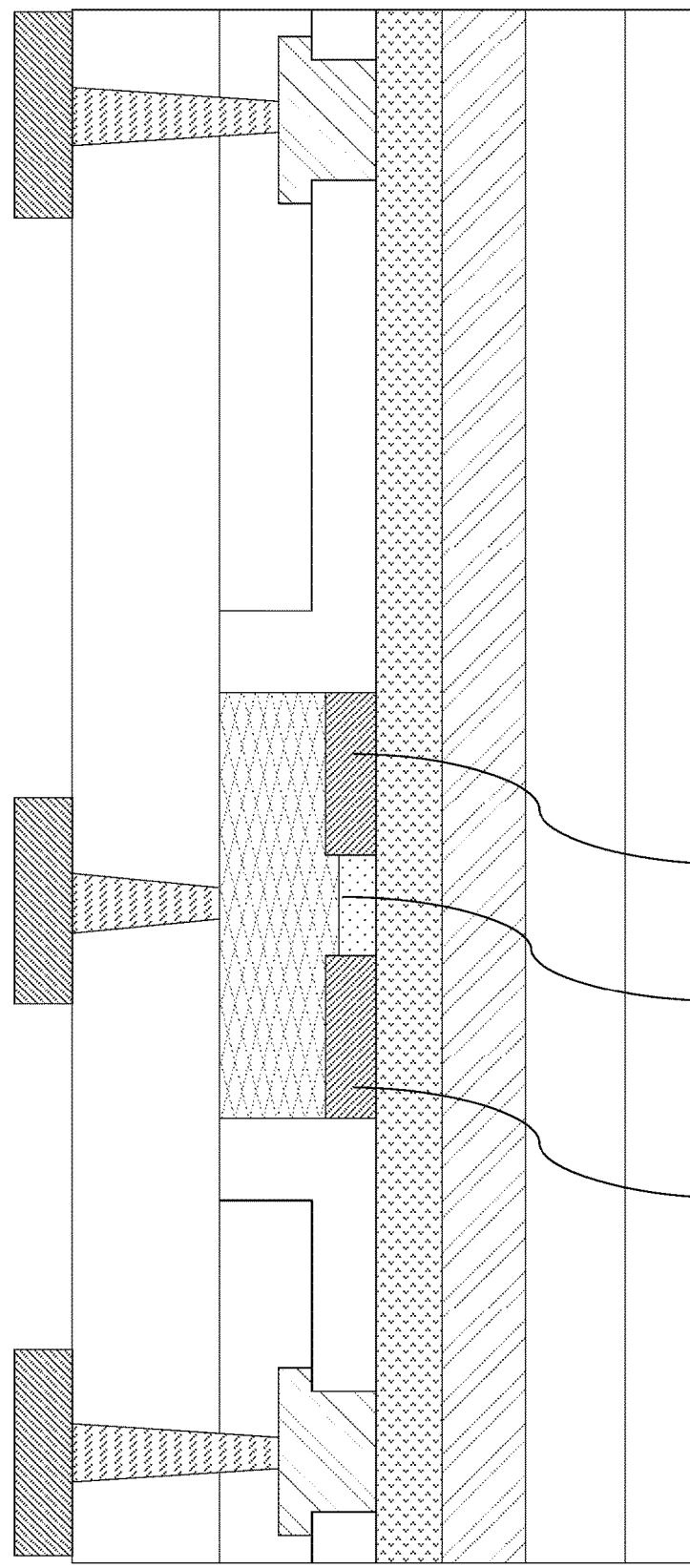

NITRIDE-BASED SEMICONDUCTOR DEVICE AND METHOD FOR MANUFACTURING THE SAME

FIELD OF THE DISCLOSURE

The present disclosure generally relates to a nitride-based semiconductor device. More specifically, the present disclosure relates to a nitride-based semiconductor device integrated with a nitride-based HEMT device and at least one Schottky diode.

BACKGROUND OF THE DISCLOSURE

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET).

SUMMARY OF THE DISCLOSURE

In accordance with one aspect of the present disclosure, a nitride-based semiconductor device is provided. A nitride-based semiconductor device including a first nitride-based semiconductor layer, a second nitride-based semiconductor layer, a source electrode, a drain electrode, and a gate structure. The second nitride-based semiconductor layer is disposed on the first nitride-based semiconductor layer and has a bandgap greater than a bandgap of the first nitride-based semiconductor layer. The source electrode and the drain electrode are disposed over the second nitride-based semiconductor layer. The gate structure is disposed over the second nitride-based semiconductor layer and between the source electrode and the drain electrode. The gate structure includes at least one conductive layer and two or more doped nitride-based semiconductor layers. The at least one conductive layer includes metal, and is in contact with the second nitride-based semiconductor layer to form a metal-semiconductor junction therebetween. The two or more doped nitride-based semiconductor layers are in contact with the second nitride-based semiconductor layer and abut against the conductive layer, so as to form contact interfaces abutting against the metal-semiconductor junction with the second nitride-based semiconductor.

In accordance with one aspect of the present disclosure, a method for manufacturing a nitride-based semiconductor device is provided. The method includes steps as follows. A first nitride-based semiconductor layer is formed on a substrate. A second nitride-based semiconductor layer is formed on the first nitride-based semiconductor layer. Two or more doped nitride-based semiconductor layers are formed to be in contact with the second nitride-based semiconductor layer and physically separated from each other. A conductive layer is formed to be in contact with the second nitride-based semiconductor layer and the doped nitride-based semiconductor layers, such that the conductive layer forms a metal-semiconductor junction between the doped nitride-based semiconductor layers with the second nitride-based semiconductor layer. A passivation layer is formed over the second nitride-based semiconductor layer to cover the doped nitride-based semiconductor layers and the conductive layer. A source electrode and a drain electrode are formed to penetrate the passivation layer to make contact with the second nitride-based semiconductor layer.

In accordance with one aspect of the present disclosure, a nitride-based semiconductor device is provided. A nitride-based semiconductor device including a first nitride-based semiconductor layer, a second nitride-based semiconductor layer, a source electrode, a drain electrode, a first doped nitride-based semiconductor layer, a second doped nitride-based semiconductor layer, and a conductive layer. The second nitride-based semiconductor layer is disposed on the first nitride-based semiconductor layer and has a bandgap greater than a bandgap of the first nitride-based semiconductor layer. The source electrode and a drain electrode are disposed over the second nitride-based semiconductor layer. The first doped nitride-based semiconductor layer is in contact with the second nitride-based semiconductor layer and closer to the source electrode than the drain electrode. The second doped nitride-based semiconductor layer is in contact with the second nitride-based semiconductor layer and between the first doped nitride-based semiconductor layer and the drain electrode. The conductive layer is disposed between the first doped nitride-based semiconductor layer and the second doped nitride-based semiconductor layer.

By the above configuration, the source, drain electrodes, the gate structure can constitute a nitride-based HEMT device with a 2DEG region. The conductive layer of the gate structure is in contact with the second nitride-based semiconductor layer (e.g., barrier layer), so as to form a metal-semiconductor junction, in which the metal-semiconductor junction can be formed to be a Schottky junction. Hence, the HEMT device and at least one Schottky diode can be integrated into the single gate structure, such that the dimension of the semiconductor device can remain in an acceptable range.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which:

FIG. 3 is a top view of a semiconductor device according to some embodiments of the present disclosure;

FIG. 8A, FIG. 8B, FIG. 8C, FIG. 8D, FIG. 8E, and FIG. 8F show different stages of a method for manufacturing a nitride-based semiconductor device according to some embodiments of the present disclosure;

FIG. 9 is a vertical cross-sectional view of a semiconductor device according to some embodiments of the present disclosure;

FIG. 10 is a vertical cross-sectional view of a semiconductor device according to some embodiments of the present disclosure.

DETAILED DESCRIPTION

Figure 1A:
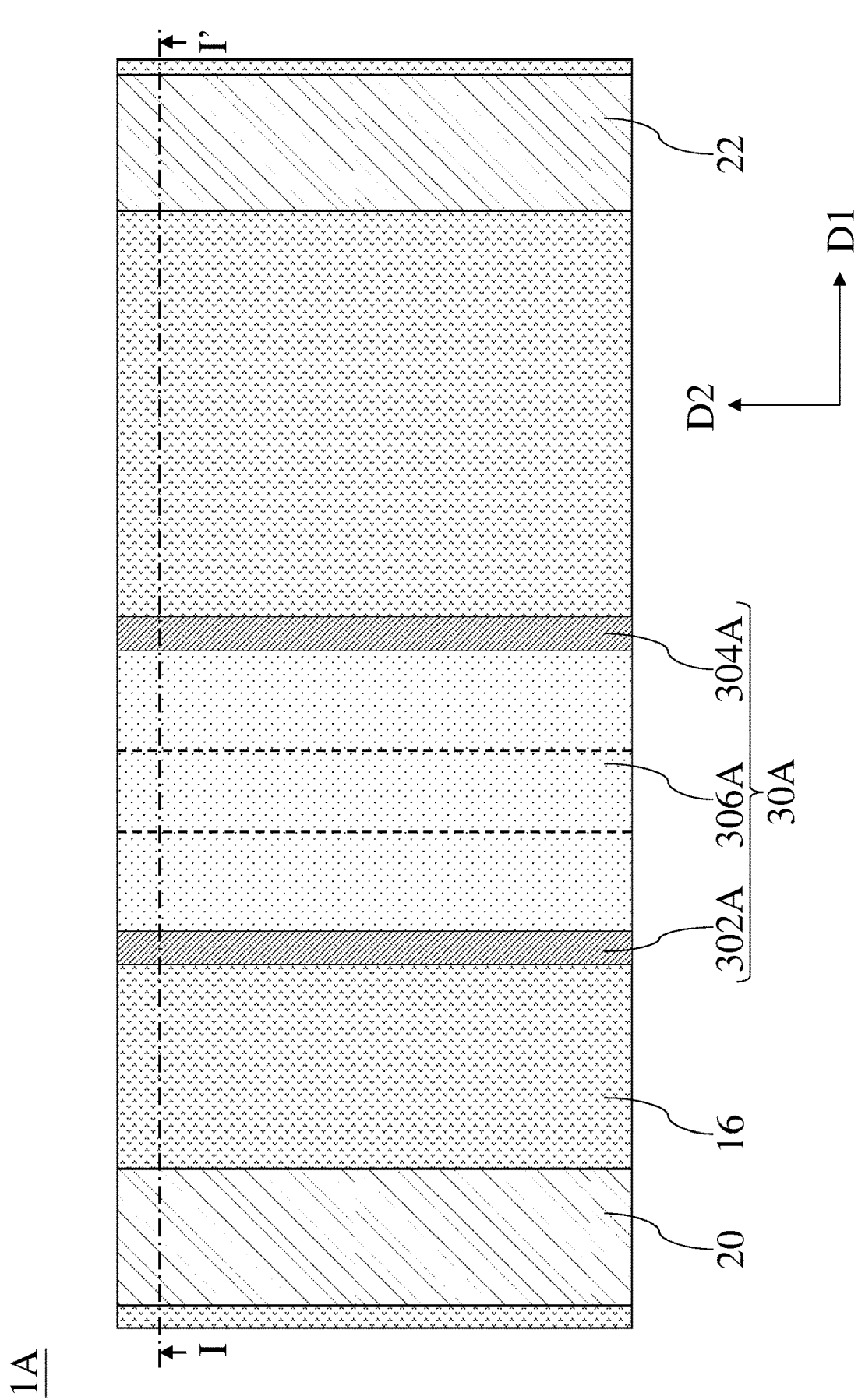
FIG. 1A is a top view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

Figure 1B:
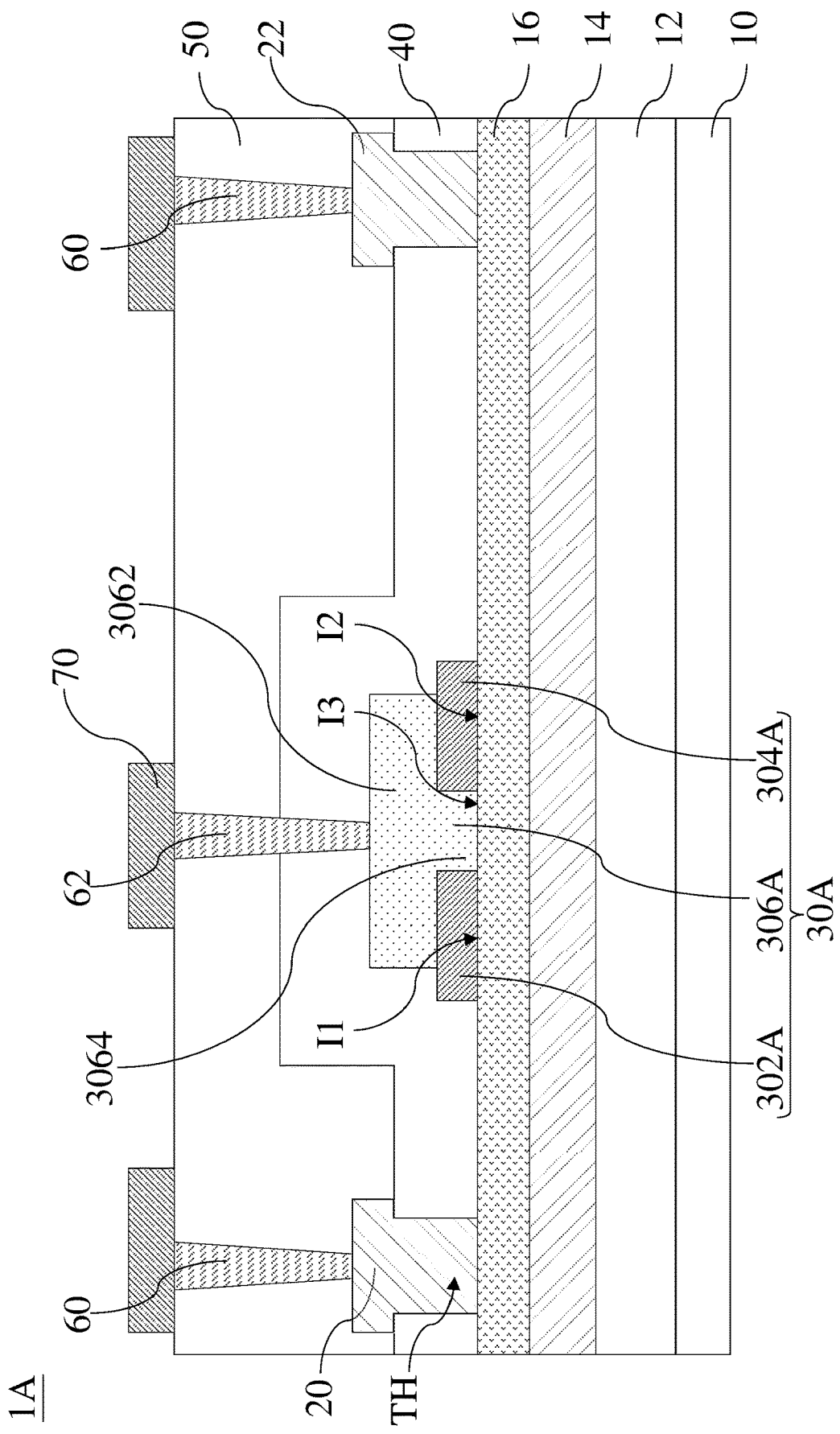
FIG. 1B is a vertical cross-sectional view of the semiconductor device taken along a line I-I' in FIG. 1A.

FIG. 1A is a top view of a semiconductor device 1A according to some embodiments of the present disclosure. FIG. 1B is a vertical cross-sectional view of the semiconductor device 1A taken along a line I-I' in FIG. 1B. Directions D1 and D2 are labeled in the FIG. 1A, in which the direction D1 is perpendicular to the direction D2. For example, the direction D1 is a horizontal direction; and the direction D2 is a vertical direction.

The semiconductor device 1A includes a substrate 10, a buffer layer 12, nitride-based semiconductor layers 14 and 16, electrodes 20 and 22, a gate structure 30A, passivation layers 40 and 50, contact vias 60 and 62, and a patterned conductive layer 70.

The substrate 10 may be a semiconductor substrate. The exemplary materials of the substrate 10 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 10 can include, for example, but is not limited to, group III elements, group IV elements, group V elements, or combinations thereof (e.g., III-V compounds). In other embodiments, the substrate 10 can include, for example but is not limited to, one or more other features, such as a doped region, a buried layer, an epitaxial (epi) layer, or combinations thereof.

The buffer layer 12 can be disposed on/over/above the substrate 10. The buffer layer 12 can be disposed between the substrate 10 and the nitride-based semiconductor layer 14. The buffer layer 12 can be configured to reduce lattice and thermal mismatches between the substrate 10 and the nitride-based semiconductor layer 14, thereby curing defects due to the mismatches/difference. The buffer layer 12 may include a III-V compound. The III-V compound can include, for example but are not limited to, aluminum, gallium, indium, nitrogen, or combinations thereof. Accordingly, the exemplary materials of the buffer layer 12 can further include, for example but are not limited to, GaN, AlN, AlGaN, InAlGaN, or combinations thereof. In some embodiments, the semiconductor device 1A may further include a nucleation layer (not shown). The nucleation layer may be formed between the substrate 10 and the buffer layer 12. The nucleation layer can be configured to provide a transition to accommodate a mismatch/difference between the substrate 10 and a III-nitride layer of the buffer layer. The exemplary material of the nucleation layer can include, for example but is not limited to AlN or any of its alloys.

In some embodiments, the semiconductor device 1A may further include a nucleation layer (not shown). The nucleation layer may be formed between the substrate 10 and the buffer layer 12. The nucleation layer can be configured to provide a transition to accommodate a mismatch/difference between the substrate 10 and a III-nitride layer of the buffer layer 12. The exemplary material of the nucleation layer can include, for example but is not limited to AlN or any of its alloys.

The nitride-based semiconductor layer 14 can be disposed on/over/above the substrate 10 and the buffer layer 12. The nitride-based semiconductor layer 16 can be disposed on/over/above the nitride-based semiconductor layer 14. The exemplary materials of the nitride-based semiconductor layer 14 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$. The exemplary materials of the nitride-based semiconductor layer 16 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$.

The exemplary materials of the nitride-based semiconductor layers 14 and 16 are selected such that the nitride-based semiconductor layer 16 has a bandgap (i.e., forbidden band width) greater/higher than a bandgap of the nitride-based semiconductor layer 14, which causes electron affinities thereof different from each other and forms a heterojunction therebetween. For example, when the nitride-based semiconductor layer 14 is an undoped GaN layer having a bandgap of approximately 3.4 eV, the nitride-based semiconductor layer 16 can be selected as an AlGaN layer having bandgap of approximately 4.0 eV. As such, the nitride-based semiconductor layers 14 and 16 can serve as a channel layer and a barrier layer, respectively. A triangular well potential is generated at a bonded interface between the channel and barrier layers, so that electrons accumulate in the triangular well, thereby generating a two-dimensional electron gas (2DEG) region adjacent to the heterojunction. Accordingly, the semiconductor device 1A is available to include at least one GaN-based high-electron-mobility transistor (HEMT).

The electrodes 20 and 22 can be disposed on/over/above the nitride-based semiconductor layer 16. The electrodes 20 and 22 can be in contact with the nitride-based semiconductor layer 16. In some embodiments, the electrode 20 can serve as a source electrode. In some embodiments, the electrode 20 can serve as a drain electrode. In some embodiments, the electrode 22 can serve as a source electrode. In some embodiments, the electrode 22 can serve as a drain electrode. The role of the electrodes 20 and 22 depends on the device design. The electrodes 20 and 22 can be arranged along the direction D1, and the electrodes 20 and 22 can extend along the direction D2 as shown in FIG. 1A.

In some embodiments, the electrodes 20 and 22 can include, for example but are not limited to, metals, alloys, doped semiconductor materials (such as doped crystalline silicon), compounds such as silicides and nitrides, other conductor materials, or combinations thereof. The exemplary materials of the electrodes 20 and 22 can include, for example but are not limited to, Ti, AlSi, TiN, or combinations thereof. Each of the electrodes 20 and 22 may be a single layer, or plural layers of the same or different composition. The electrodes 20 and 22 can form ohmic contacts with the nitride-based semiconductor layer 16. Furthermore, the ohmic contacts can be achieved by applying Ti, Al, or other suitable materials to the electrodes 20 and 22. In some embodiments, each of the electrodes 20 and 22 is formed by at least one conformal layer and a conductive filling. The conformal layer can wrap the conductive filling. The exemplary materials of the conformal layer can include, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The gate structure 30A can be disposed on/over/above the nitride-based semiconductor layer 16. The gate structure 30A can be disposed between the electrodes 20 and 22. The gate structure 30A includes two doped nitride-based semiconductor layers 302A and 304A, and a conductive layer 306A. The doped nitride-based semiconductor layers 302A and 304A, and the conductive layer 306A can be arranged along the direction D1. The doped nitride-based semiconductor layers 302A and 304A, and the conductive layer 306 can extend continuously along the direction D2 as shown in FIG. 1A. The electrodes 20 and 22 and the gate structure 30 can at least constitute a GaN-based HEMT device with the 2DEG region.

In the exemplary illustration of FIG. 1B, the semiconductor device 1A is an enhancement mode device, which is in a normally-off state when the conductive layer 306A is at approximately zero bias. Specifically, the doped nitride-based semiconductor layers 302A and 304A may create p-n junctions with the nitride-based semiconductor layer 16 to deplete the 2DEG region, such that zones of the 2DEG region corresponding to positions below the corresponding the doped nitride-based semiconductor layers 302A and 304A have different characteristics (e.g., different electron concentrations) than the remaining portion of the 2DEG region and thus is blocked.

Due to such mechanism, the semiconductor device 1A has a normally-off characteristic. In other words, when no voltage is applied to the conductive layer 306A or a voltage applied to the conductive layer 306A is less than a threshold voltage (i.e., a minimum voltage required to form an inversion layer below the conductive layer 306A), the zones of the 2DEG region below the doped nitride-based semiconductor layers 302A and 304A are kept blocked, and thus no current flows therethrough.

The configuration of the gate structure 30A can be applied to a DC-DC converter circuit, thereby avoiding excessive variation of load current of in the DC-DC converter circuit.

Figure 1C:
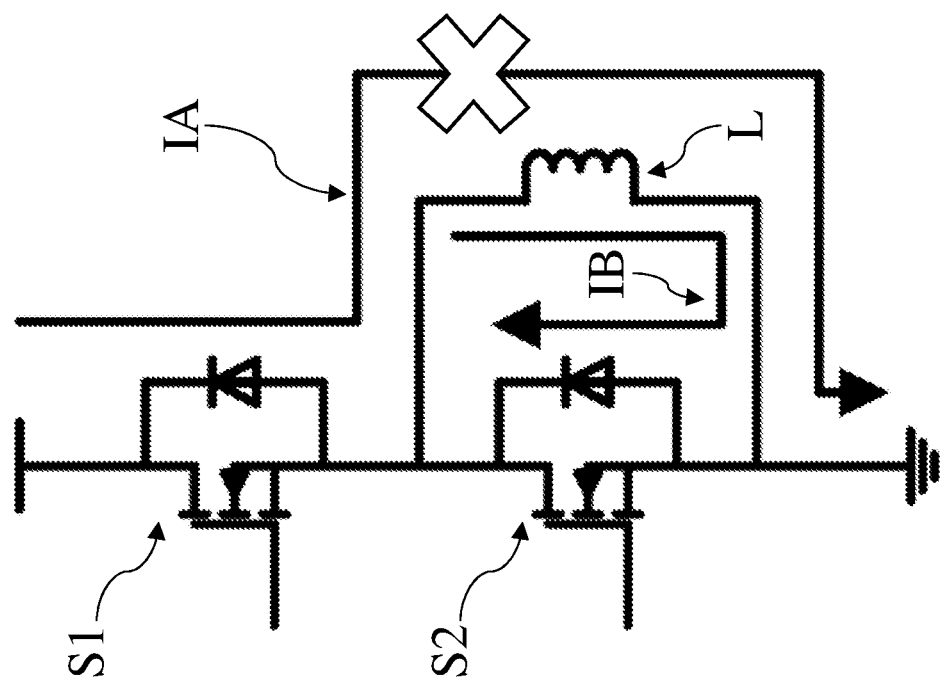
FIG. 1C is a schematic diagram of a circuit applying transistors according to some embodiments of the present embodiments.

To illustrate, FIG. 1C is a schematic diagram of a circuit applying transistors S1 and S2 according to some embodiments of the present embodiments. The transistor S1 and S2 are GaN-based HEMT. The transistor S1 and S2 are in series connection. An inductor L is connected across the transistor S2.

During the operation, when the transistor S1 is turned off and thus a current 1A is cut off, since a current 1B in the loading inductor L cannot change suddenly, the transistor S2 needs to provide a freewheeling operating state for the current 1B. Therefore, a current release circuit can be provided with a freewheeling diode. The freewheeling diode may be achieved by a Schottky diode. However, an additional configuration of a Schottky diode would increase overall size of an electronic device, which is unfavorable to electronics miniaturization. For example, once a Schottky diode is disposed at a location between a gate and a drain of a HEMT so the a Schottky diode and the HEMT are integrated into one die, the die size will get enlarged. Further, an extra connection from the Schottky diode to an external is needed so the layout of the die will become more complex.

At least to avoid the afore-mentioned issues, the present disclosure is to provide a novel way to integrate a HEMT device with a Schottky diode.

Referring to FIG. 1B again, with respect to the gate structure 30A of the semiconductor device 1A, the doped nitride-based semiconductor layers 302A and 304A can be in contact with the nitride-based semiconductor layer 16, so as to form contact interfaces I1 and I2 with the nitride-based semiconductor 16. The doped nitride-based semiconductor layers 302A and 304A are physically separated from each other. The contact interfaces I1 and I2 are physically separated from each other.

The conductive layer 306A can be disposed on/over/above the doped nitride-based semiconductor layers 302A and 304A. The conductive layer 306A extends along side surfaces of the doped nitride-based semiconductor layers 302A and 304A to top surfaces of the doped nitride-based semiconductor layers 302A and 304A. The conductive layer 306A includes a main body portion 3062 and an extending portion 3064.

The main body portion 3062 can be disposed on/over/above and in contact with the top surfaces of the doped nitride-based semiconductor layers 302 and 304. The extending portion 3064 extends downward from the main body portion 3062. The extending portion 3064 can be positioned/sandwiched/located between the doped nitride-based semiconductor layers 302A and 304A. The extending portion 3064 can be in contact with the sides surfaces of the doped nitride-based semiconductor layers 302A and 304A.

The extending portion 3064 can be in contact with a top surface of the nitride-based semiconductor layer 16.

The exemplary materials of the conductive layer 306A may include metal compounds. The conductive layer 306A may be formed as a single layer, or plural layers of the same or different compositions. The exemplary materials of the metal compounds can include, for example but are not limited to, titanium nitride (TiN) or tantalum nitride (TaN), tungsten nitride (WN), tungsten (W), nickel (Ni), or combinations thereof. The conductive layer 306A may be formed from metal alloy which may include, for example but are not limited to, titanium/gold (Ti/Au), titanium/aluminum/nickel/gold (Ti/Al/Ni/Au), or combinations thereof. Hence, a metal-semiconductor junction I3 can be formed between the extending portion 3064 of the conductive layer 306 and the nitride-based semiconductor layer 16. The metal-semiconductor junction I3 is located between the contact interfaces I1 and I2. The contact interfaces I1 and I2 abut against the metal-semiconductor junction I3.

During the formation of the conductive layer 306A, the manufacturing process temperature thereof can be controlled within a room temperature, such that the metal-semiconductor junction I3 can be formed to be a Schottky junction interface. As such, the conductive layer 306A and the nitride-based semiconductor layer 16 can form a Schottky diode across the metal-semiconductor junction I3. The conductive layer 306A and each of the doped nitride-based semiconductor layers 302A and 304A can form a Schottky junction interface. When the semiconductor device 1A is in reverse on operation, the gate structure 30A including the aforesaid interfaces can act as a junction barrier Schottky (JBS) diode. As such, the Schottky diode can be integrated into the gate structure 30A.

The doped nitride-based semiconductor layer 302A can form a heterojunction at the contact interface I1 with the nitride-based semiconductor layer 16 (e.g., barrier layer). The doped nitride-based semiconductor layer 304A can form a heterojunction at the contact interface I2 with the nitride-based semiconductor layer 16. As such, a PN diode across the heterojunction (e.g., the contact interface I1 or I2) can be formed between the doped nitride-based semiconductor layer 302A or 304A and the 2DEG region (e.g., which is near the heterojunction between the nitride-based semiconductor layers 14 and 16). Such the PN diodes can be applied to deplete the 2DEG region, achieving the enhancement mode of the semiconductor device 1A. The reason for forming the two contact interfaces I1 and I2 abutting against the metal-semiconductor junction I3 is to effectively bring the semiconductor device 1A into the enhancement mode. For example, once one of the contact interfaces I1 and I2 is omitted and the corresponding doped nitride-based semiconductor layer 302A or 304A is too narrow (i.e., too short), the effect of the depletion to the 2DEG region may be insufficient to the enhancement mode.

Based on above, in the present disclosure, at least an extending portion 3064 of the conductive layer 306A of the gate structure 30 extends to a space/region between the doped nitride-based semiconductor layers 302A and 304A, so as to form a metal-semiconductor junction I3 between the extending portion 3064 and the nitride-based semiconductor layer 16. Further, by at least controlling manufacturing process temperature parameter of the conductive layer 306A within a room temperature, the metal-semiconductor junction I3 can be formed to be a Schottky junction interface, so a Schottky diode is formed across the Schottky junction interface. As such with a HEMT device and the Schottky diode can be integrated into the semiconductor device 1A so the dimension of the semiconductor device 1A can remain in an acceptable range. Moreover, the semiconductor device 1A can be suitable for a DC-DC converter circuit. Moreover, the saturation current of the semiconductor device 1A can be further promoted due to the introduction of the Schottky diode, and therefore, the semiconductor device 1A can have good electrical properties.

The passivation layer 40 can be disposed on/over/above the nitride-based semiconductor layer 16 and the gate structure 30A. The passivation layer 40 can be conformal with the gate structure 30A, so as to form a protruding portion. The passivation layer 40 includes a plurality of through holes TH. The electrodes 20 and 22 can penetrate the passivation layer 40 through the through holes TH to be in contact with the nitride-based semiconductor layer 16.

The material of the passivation layer 40 can include, for example but are not limited to, dielectric materials. For example, the passivation layer 40 can include, for example but not limited to, $SiN_x$, $SiO_x$, $Si_3N_4$, SiON, SiC, SiBN, SiCBN, oxides, nitrides, plasma enhanced oxide (PEOX), or combinations thereof. In some embodiments, the passivation layer 40 can be a multi-layered structure, such as a composite dielectric layer of $Al_2O_3$/SiN, $Al_2O_3$/$SiO_2$, AlN/SiN, AlN/$SiO_2$, or combinations thereof.

The passivation layer 50 can be disposed on/over/above the electrodes 20 and 22, and the passivation layer 40. The exemplary material of the passivation layer 50 can be identical with or similar with that of the passivation layer 40. Moreover, the passivation layer 50 can serve as a planarization layer which has a level top surface to support other layers/elements. In some embodiments, the passivation layer 50 can be formed as a thicker layer, and a planarization process, such as chemical mechanical polish (CMP) process, is performed on the passivation layer 50 to remove the excess portions, thereby forming a level top surface.

The contact vias 60 can be disposed within the passivation layer 50. The contact vias 60 can penetrate the passivation layer 50. The contact via 62 can be disposed within the passivation layers 40 and 50. The contact via 62 can penetrate the passivation layers 40 and 50. The contact vias 60 can extend longitudinally to connect to the electrodes 20 and 22, respectively. The contact via 62 makes a contact with the conductive layer 306 and extending upward from the conductive layer 306A. The contact via 62 can extend longitudinally to connect to the conductive layer 306A. The upper surfaces of the contact vias 60 and 62 are free from coverage of the passivation layer 50.

The contact via 62 can align with the metal-semiconductor junction I3. The contact via 62 can be located directly on the metal-semiconductor junction I3. Therefore, the gate structure 30A allows the reverse current to flow through the metal-semiconductor junction I3 and to be guided to the contact via 62.

The exemplary materials of the contact vias 60 and 62 can include, for example but are not limited to, conductive materials, such as metals or alloys.

The patterned conductive layer 70 can be disposed on/over/above the passivation layer 50 and the contact vias 60 and 62. The patterned conductive layer 70 is in contact with the contact vias 60 and 62. The patterned conductive layer 70 may have metal lines, pads, traces, or combinations thereof, such that the patterned conductive layer 70 can form at least one circuit. Hence, the patterned conductive layer 70 can serve as a patterned circuit layer. The patterned conductive layer 70 can connect with the electrodes 20 and 22, and the conductive layer 306A by the contact vias 60 and 62, respectively. An external electronic device can send at least one electronic signal to the semiconductor device 1A by the patterned conductive layer 70, and vice versa.

The exemplary materials of the patterned conductive layer 70 can include, for example but are not limited to, conductive materials. The patterned conductive layer 70 may include a single film or multilayered film having Ag, Al, Cu, Mo, Ni, Ti, alloys thereof, oxides thereof, nitrides thereof, or combinations thereof.

Different stages of a method for manufacturing the semiconductor device 1A are shown in FIG. 2A, FIG. 2B, FIG. 2C, and FIG. 2D, described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figure 2A:
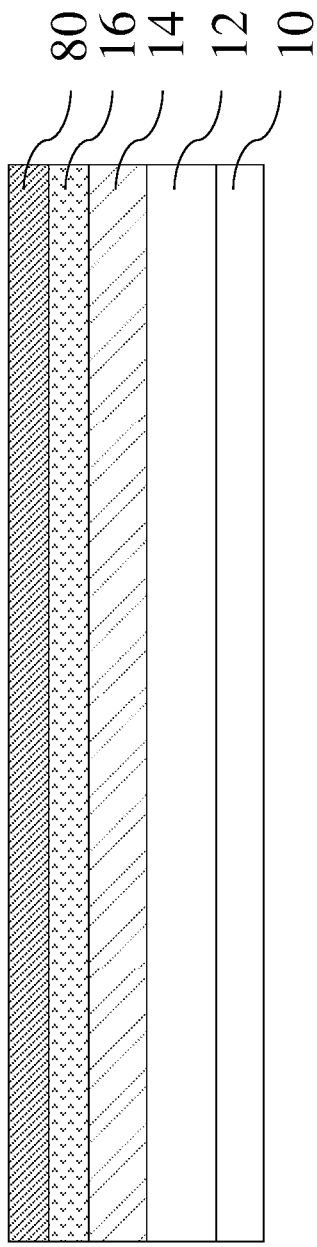
FIG. 2A, FIG. 2B, FIG. 2C, and FIG. 2D show different stages of a method for manufacturing a nitride-based semiconductor device according to some embodiments of the present disclosure.

Referring to FIG. 2A, a substrate 10 is provided. A buffer layer 12 can be formed on/over/above the substrate 10 by using deposition techniques. Nitride-based semiconductor layers 14 and 16 can be formed on/over/above the substrate 12 in sequence by using deposition techniques. A blanket doped nitride-based semiconductor layer 80 can be formed on/over/above the nitride-based semiconductor layer 16. In some embodiments, the deposition techniques can be performed for forming a blanket layer, and the patterning process can be performed for removing excess portions thereof.

Figure 2B:
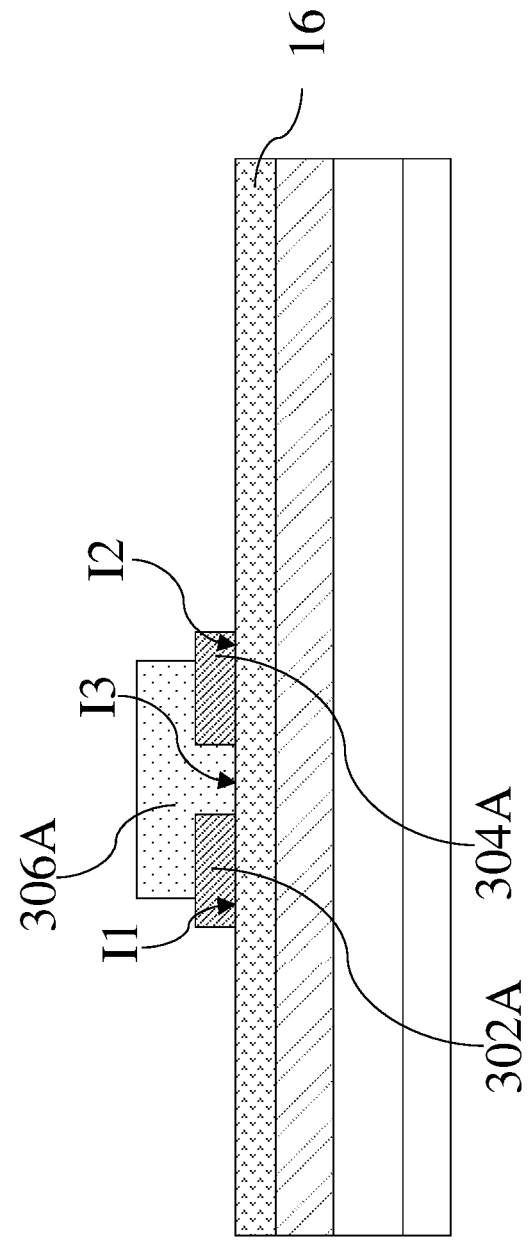

Referring to FIG. 2B, a patterning process is performed on the blanket doped nitride-based semiconductor layer 80, so as to form the two doped nitride-based semiconductor layers 302A and 304A. The doped nitride-based semiconductor layer 302A can form a contact interface I1 with the nitride-based semiconductor layer 16. The doped nitride-based semiconductor layer 304A can form a contact interface I2 with the nitride-based semiconductor layer 16. The doped nitride-based semiconductor layers 302A and 304A are physically separated from each other.

In some embodiments, the doped nitride-based semiconductor layers 302A and 304A can be formed with the same width. In some embodiments, the doped nitride-based semiconductor layers 302A and 304A can be formed with the different width. In some embodiments, the number of the doped nitride-based semiconductor layers can be greater than two. For example, more than two doped nitride-based semiconductor layers can be arranged as an array. The number and the widths of the doped nitride-based semiconductor layers can be determined by the pattern of the mask layer applied during the patterning process.

A blanket conductive layer (not shown) is formed on/over/above the nitride-based semiconductor layer 16 and the doped nitride-based semiconductor layers 302A and 304A, so as to be in contact with the nitride-based semiconductor layer 16 and the doped nitride-based semiconductor layers 302A and 304A. The blanket conductive layer is formed to entirely fill a space/region between the doped nitride-based semiconductor layers 302A and 304A. A patterning process is performed on the blanket conductive layer to remove the excess portions thereof, thereby forming the conductive layer 306A. The exemplary materials of the blanket conductive layer can be TiN or TaN; and therefore, the conductive layer 306A can form a metal-semiconductor junction I3 between the doped nitride-based semiconductor layers 302A and 304A with the nitride-based semiconductor layer 16. In some embodiments, the exemplary materials of the blanket conductive layer can include, for example but are not limited to, tungsten nitride (WN), tungsten (W), nickel (Ni), or combinations thereof. The blanket conductive layer may be formed from metal alloy which may include, for example but are not limited to, titanium/gold (Ti/Au), titanium/aluminum/nickel/gold (Ti/Al/Ni/Au), or combinations thereof.

Figure 2C:
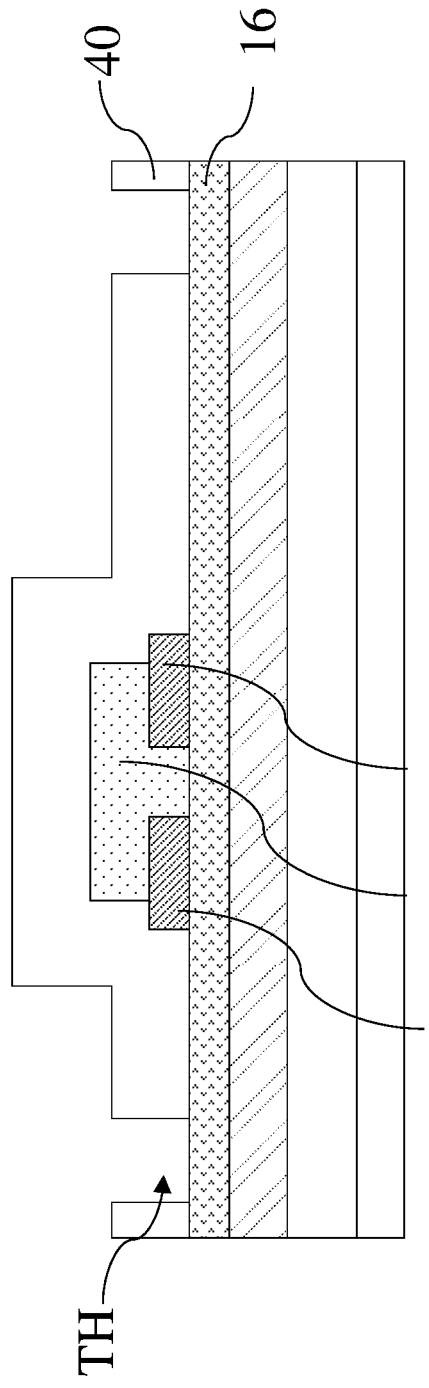

Referring to FIG. 2C, a passivation layer 40 can be formed on/over/above the nitride-based semiconductor layer 16 to cover the doped nitride-based semiconductor layers 302A and 304A, and the conductive layer 306A. The formation of the passivation layer 40 includes the deposition techniques and the patterning process. The passivation layer 40 is patterned to have a plurality of the through holes TH for exposing at least a part of the nitride-based semiconductor layer 16.

Figure 2D:
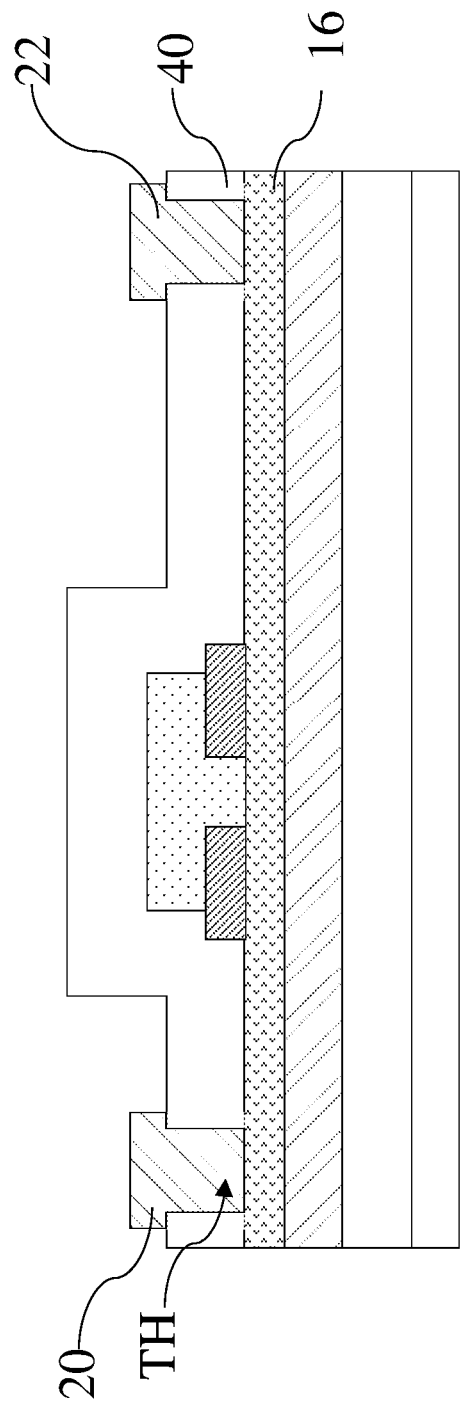

Referring to FIG. 2D, electrodes 20 and 22 can be formed on/over/above the nitride-based semiconductor layer 16 and can be formed to penetrate the passivation layer 40 by the though holes TH. The electrodes 20 and 22 can make contact with the nitride-based semiconductor layer 16. The formation of the electrodes 20 and 22 can include the deposition techniques and the patterning process. Thereafter, a passivation layer 50, contact vias 60 and 62, and a patterned circuit layer 70 can be formed, obtaining the configuration of the semiconductor device 1A as shown in FIG. 1A and FIG. 1B.

FIG. 3 is a top view of a semiconductor device 1B according to some embodiments of the present disclosure. The semiconductor device 1B is similar to the semiconductor device 1A as described and illustrated with reference to FIG. 1A, except that the gate structure 30A is replaced by a gate structure 30B.

The gate structure 30B includes doped nitride-based semiconductor layers 302B and 304B and a conductive layer 306B. The conductive layer 306B is disposed between the doped nitride-based semiconductor layers 302B and 304B. The doped nitride-based semiconductor layers 302B are arranged in an array on the nitride-based semiconductor layer 16. The doped nitride-based semiconductor layers 302B are arranged along the direction D2 and are separated from each other.

The configuration of the doped nitride-based semiconductor layers 302B can be applied to the doped nitride-based semiconductor layers 304B, so there are two arrays on the nitride-based semiconductor layer 16.

The conductive layer 306B covers the two arrays. By employing such a configuration, the contact area (e.g., the overall area of the Schottky junction interface) between the conductive layer 306B and the nitride-based semiconductor layer 16 can be enhanced, and thus the forward saturation current and the reverse saturation current of the semiconductor device 1B can be increased.

In the exemplary illustration of FIG. 3, the two array align with each other so they are entirely and horizontally overlap with each other. In other embodiments, the two array misalign with each other.

Figure 4:
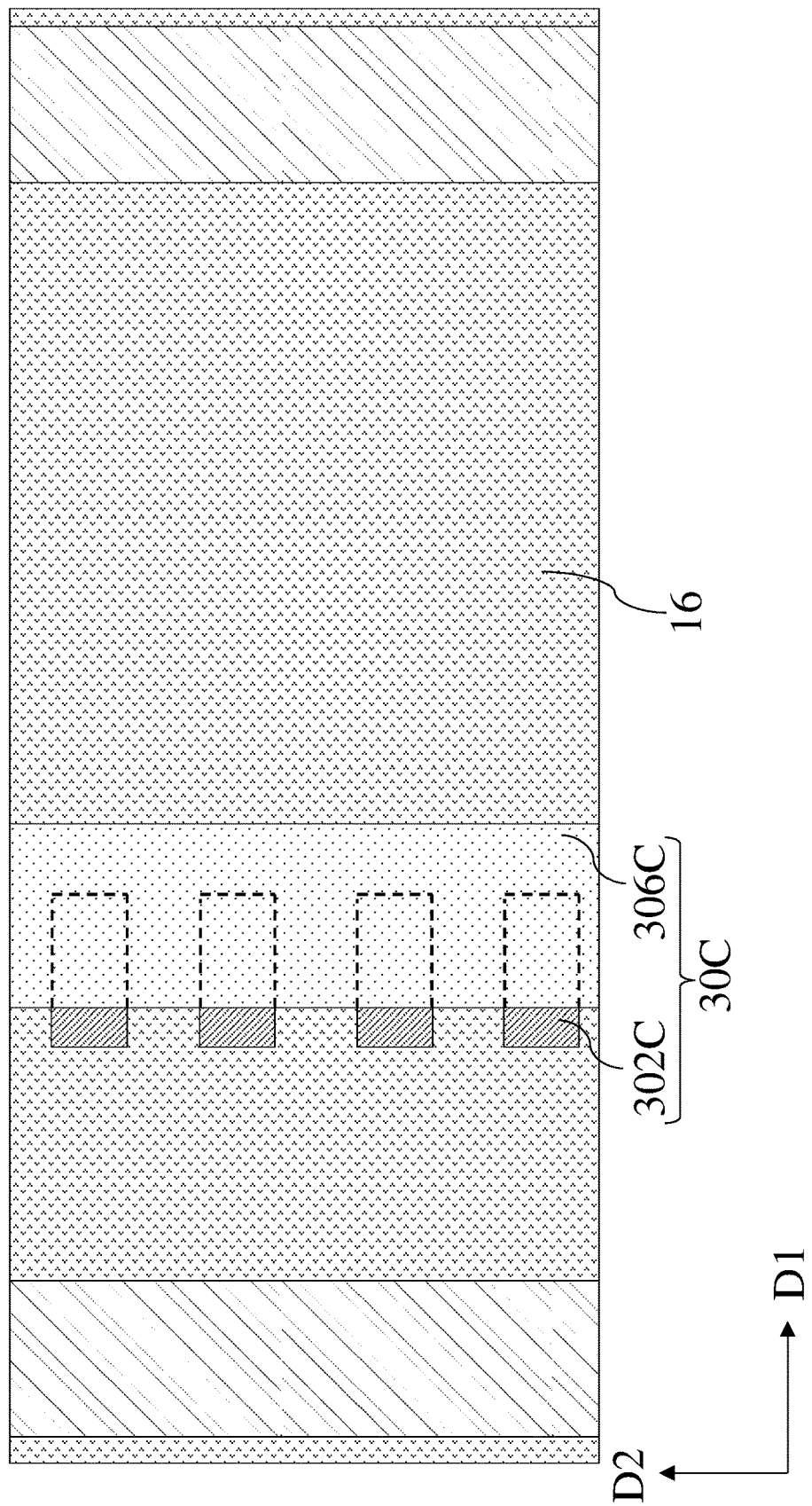
FIG. 4 is a top view of a semiconductor device according to some embodiments of the present disclosure.

FIG. 4 is a top view of a semiconductor device 1C according to some embodiments of the present disclosure. The semiconductor device 1C is similar to the semiconductor device 1A as described and illustrated with reference to FIG. 1A and FIG. 1B, except that the gate structure 30A is replaced by a gate structure 30C.

The gate structure 30C includes doped nitride-based semiconductor layers 302C and a conductive layer 306C over the doped nitride-based semiconductor layers 302C. The doped nitride-based semiconductor layers 302C are arranged in an array on the nitride-based semiconductor layer 16, and there in only one array arranged by the doped nitride-based semiconductor layers 302C. The doped nitride-based semiconductor layers 302C are arranged in the direction D2. The conductive layer 306C covers the array, and fills each of the region between the two adjacent doped nitride-based semiconductor layers 302C. Each of the doped nitride-based semiconductor layers 302C is wide enough to provide the depletion to the 2DEG region. For example, each of the doped nitride-based semiconductor layers 302C can laterally extend over a central line of the conductive layer 306C. That is the overlapped length of the conductive layer 306C and each of the doped nitride-based semiconductor layers 302C is greater than half of a width of the conductive layer 306C.

Figure 5:
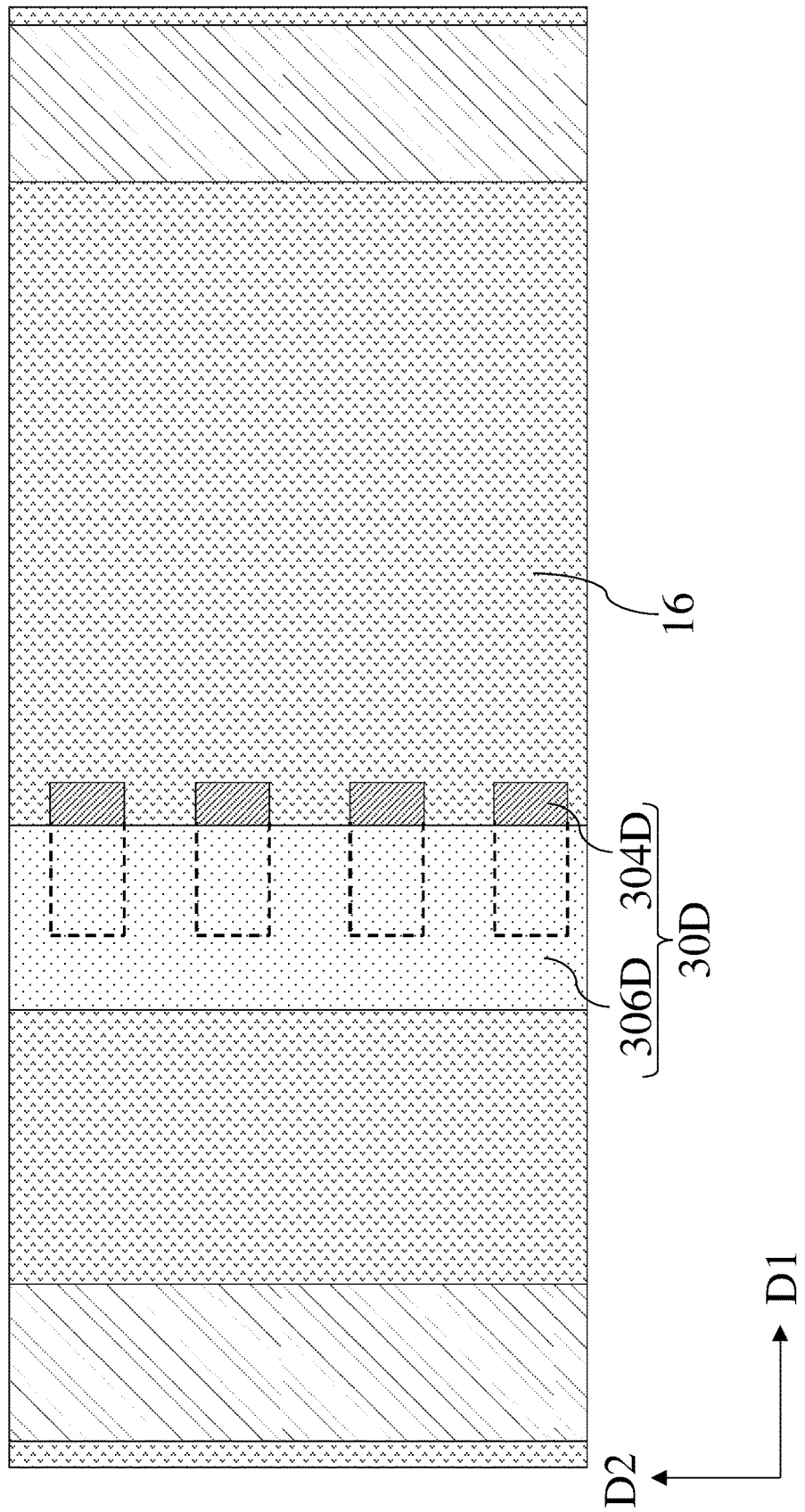
FIG. 5 is a top view of a semiconductor device according to some embodiments of the present disclosure.

FIG. 5 is a top view of a semiconductor device 1D according to some embodiments of the present disclosure. The semiconductor device 1D is similar to the semiconductor device 1A as described and illustrated with reference to FIG. 1A and FIG. 1B, except that the gate structure 30A is replaced by a gate structure 30D.

The gate structure 30D includes doped nitride-based semiconductor layers 304D and a conductive layer 306D over the doped nitride-based semiconductor layers 304D. The doped nitride-based semiconductor layers 304D are arranged in an array on the nitride-based semiconductor layer 16, and there in only one array arranged by the doped nitride-based semiconductor layers 304D. The doped nitride-based semiconductor layers 304D are arranged in the direction D2. The conductive layer 306D covers the array, and fills each of the region between the two adjacent doped nitride-based semiconductor layers 304D. Each of the doped nitride-based semiconductor layers 304D is wide enough to provide the depletion to the 2DEG region. For example, each of the doped nitride-based semiconductor layers 304D can laterally extend over a central line of the conductive layer 306D. That is the overlapped length of the conductive layer 306D and each of the doped nitride-based semiconductor layers 304D is greater than half of a width of the conductive layer 306D.

Figure 6:
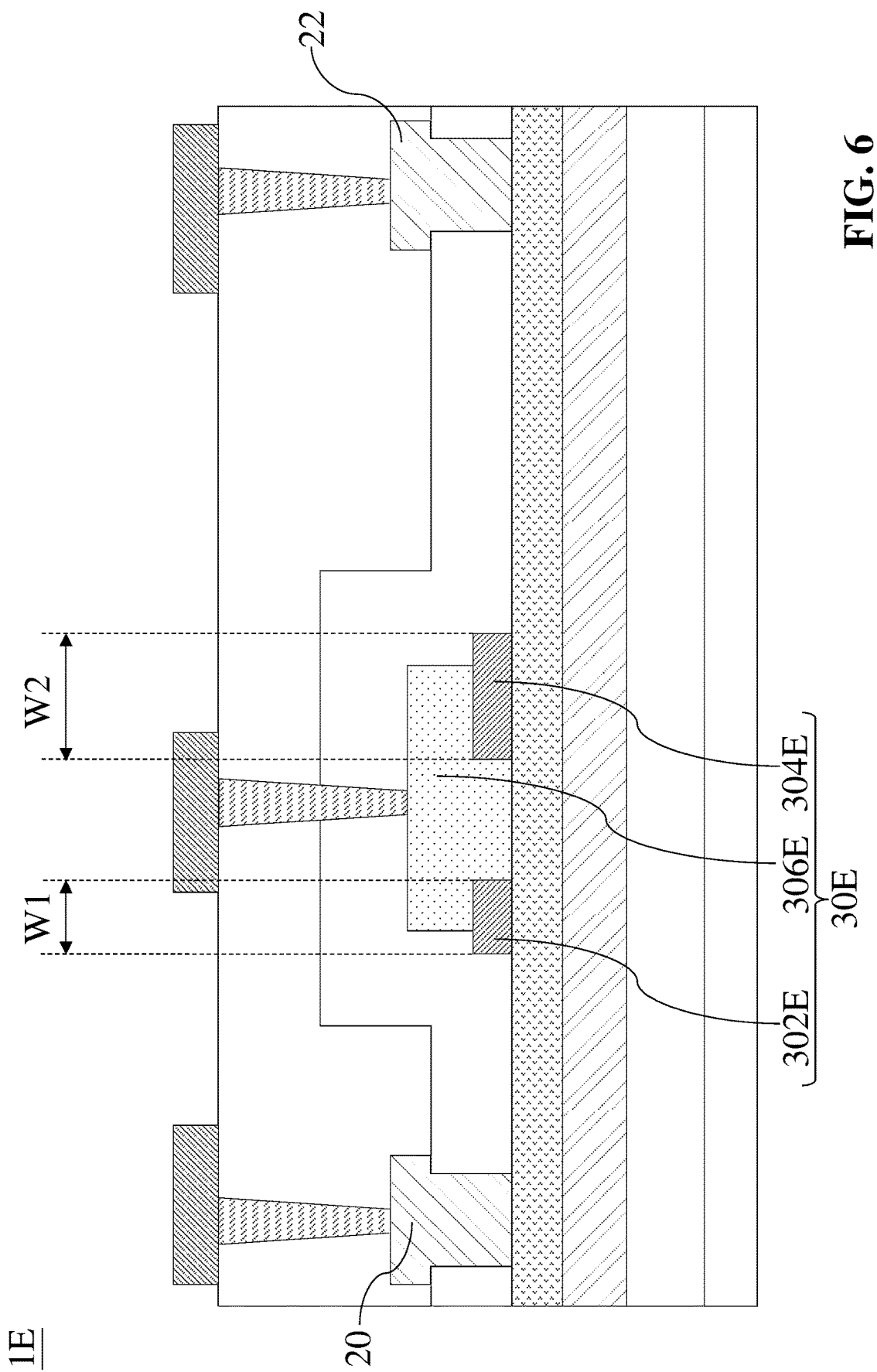
FIG. 6 is a vertical cross-sectional view of a semiconductor device according to some embodiments of the present disclosure.

FIG. 6 is a vertical cross-sectional view of a semiconductor device 1E according to some embodiments of the present disclosure. The semiconductor device 1E is similar to the semiconductor device 1A as described and illustrated with reference to FIG. 1A, except that the gate structure 30A is replaced by a gate structure 30E.

The gate structure 30E includes doped nitride-based semiconductor layers 302E and 304E and a conductive layer 306E. The conductive layer 306E is disposed between the doped nitride-based semiconductor layers 302E and 304E. The doped nitride-based semiconductor layer 302E is located between the electrode 20 and the conductive layer 306. The doped nitride-based semiconductor layer 304E is located between the electrode 22 and the doped nitride-based semiconductor layer 302E. The doped nitride-based semiconductor layer 302E is closer to the electrode 20 than the electrode 22. The doped nitride-based semiconductor layer 302E has a width W1.

The doped nitride-based semiconductor layer 304E is located between the conductive layer 306 and the electrode 22. The doped nitride-based semiconductor layer 302E has a width W2. The width W2 of the doped nitride-based semiconductor layer 304E is greater than the width W1 of the doped nitride-based semiconductor layer 302E. That is, the doped nitride-based semiconductor layer 302E is narrower than the doped nitride-based semiconductor layer 304E.

Furthermore, the concentration of the p-type impurities of the doped nitride-based semiconductor layer 302E can be less than that of the doped nitride-based semiconductor layer 304E.

In some embodiments involving that the electrodes 20 and 22 serve as a source electrode and a drain electrode respectively, the aforesaid concentration and width design can enhance the performance of the semiconductor device 1E, because the impedance of the current flowing from the source electrode (i.e., the electrode 20) to the conductive layer 306E of the gate structure 30E is reduced, thereby improving the flowing of the freewheeling current.

Figure 7:
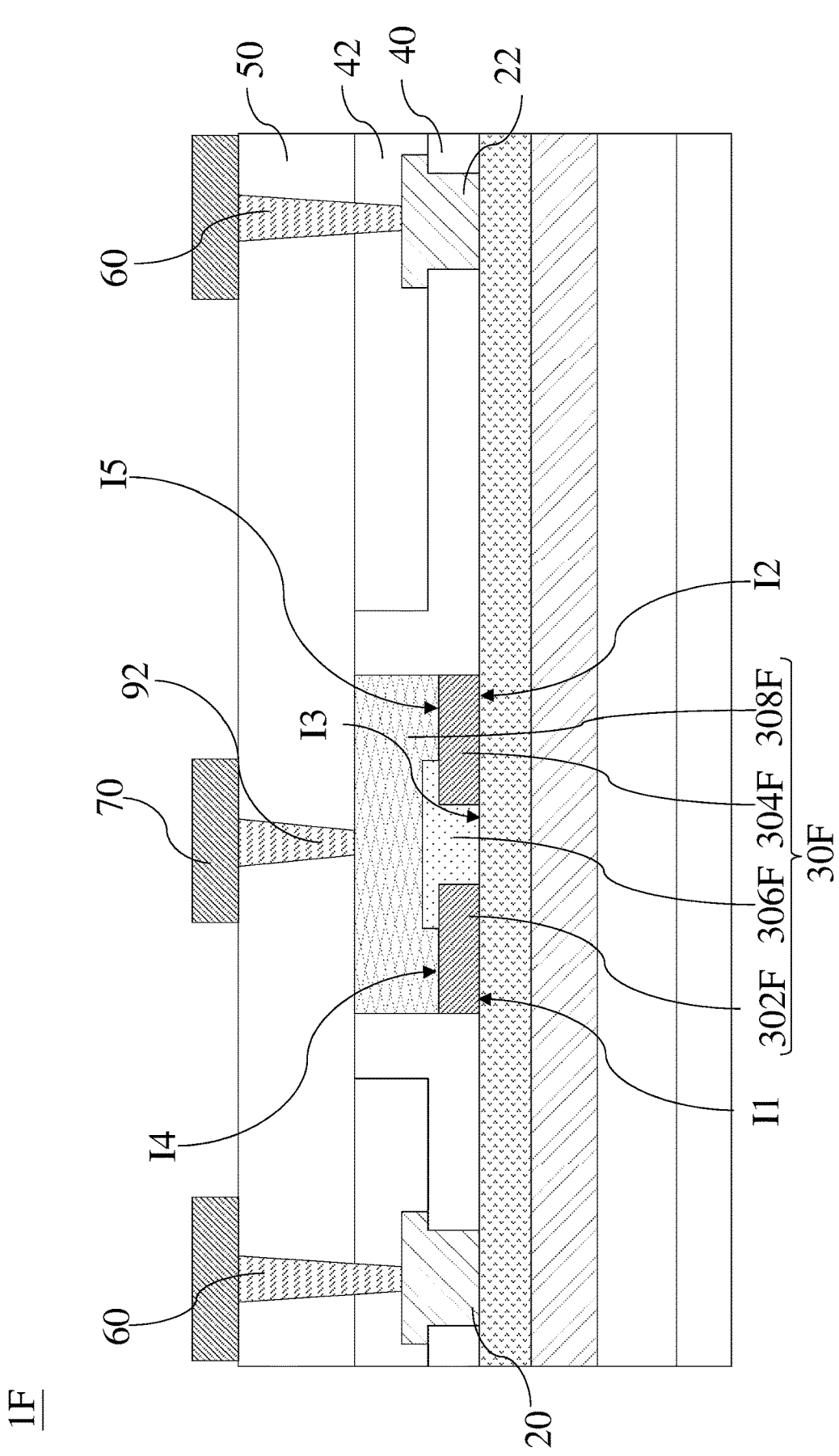
FIG. 7 is a vertical cross-sectional view of a semiconductor device according to some embodiments of the present disclosure.

FIG. 7 is a vertical cross-sectional view of a semiconductor device 1F according to some embodiments of the present disclosure. The semiconductor device 1F is similar to the semiconductor device 1A as described and illustrated with reference to FIG. 1A and FIG. 1B, except that the gate structure 30A is replaced by a gate structure 30F.

The gate structure 30F includes doped nitride-based semiconductor layers 302F and 304F, a conductive layer 306, and a metal layer 308F. The material of the metal layer 308F is different from that of the conductive layer 306F. For example, the metal layer 308F is made of metal and the conductive layer 306F is made of conductive compound.

The passivation layer 42 can be disposed on/over/above the passivation layer 40, and the electrodes 20, 22. The contact vias 60 penetrate the passivation layers 42 and 50, so as to be in contact with the electrodes 20 and 22. The exemplary material of the passivation layer 42 can be identical with or similar with that of the passivation layer 40.

The metal layer 308F covers the conductive layer 306F and the doped nitride-based semiconductor layers 302F and 304F. The metal layer 308F can make contacts with the conductive layer 308F, and the doped nitride-based semiconductor layers 302F and 304F.

A contact interface I4 can be formed between the metal layer 308F and the doped nitride-based semiconductor layer 302F. A contact interface I5 can be formed between the metal layer 308F and the doped nitride-based semiconductor layer 304F. The conductive layer 306F has a top surface in a position high than top surfaces of the doped nitride-based semiconductor layers 302F and 304F. The metal layer 308F directly covers the top surfaces of the conductive layer 306F and the doped nitride-based semiconductor layers 302F and 304F.

A contact via 92 is located between the patterned conductive layer 70 and the metal layer 308F, so as to connect the patterned conductive layer 70 and the metal layer 308F. The contact via 92 makes contact with the metal layer 308F and extends upward from the metal layer 308F. The contact via 92 is electrically coupled with the conductive layer 306F through the metal layer 308F.

During the formation of the metal layer 308F, the process temperature can be controlled in a high temperature (e.g., at about 875° C.), such that the contact interfaces 14 and 15 can become ohmic contact interfaces. The configuration of the metal layer 308F can increase the area of the ohmic contact in the semiconductor device 1F.

When the semiconductor device 1F is in reverse on operation, the gate structure 30F including the aforesaid interfaces (i.e., contact interfaces I1, I2, I3, I4 and I5) can act as a merged P-i-N Schottky (MPS) diode. Specifically, during the working period of the semiconductor device 1F, the Schottky diode across the metal-semiconductor junction I3 can be turned on when a small voltage is applied to the gate structure 30F; and the PN diodes across the contact interfaces I1 and I2 can be turned on when a large voltage is applied to the gate structure 30F.

Different stages of a method for manufacturing the semiconductor device 1F are shown in FIG. 8A, FIG. 8B, FIG. 8C, FIG. 8D, FIG. 8E, and FIG. 8F, as described below.

Referring to FIG. 8A, a substrate 10 is provided. A buffer layer 12 can be formed on/over/above the substrate 10 by using deposition techniques. Nitride-based semiconductor layers 14 and 16 can be formed over the substrate 12 in sequence by using deposition techniques. The separated doped nitride-based semiconductor layers 302F and 304F can be formed on/over/above the nitride-based semiconductor layer 16. The formation of the doped nitride-based semiconductor layers 302F and 304F can include the deposition techniques and the patterning process.

Referring to FIG. 8B, a conductive layer 306F can be formed on/over/above the nitride-based semiconductor layer 16 and the doped nitride-based semiconductor layers 302F and 304F, so as to be in contact with the nitride-based semiconductor layer 16 and the doped nitride-based semiconductor layers 302F and 304F. The conductive layer 306F can be formed to entirely fill a space/region between the doped nitride-based semiconductor layers 302F and 304F.

Figure 8C:
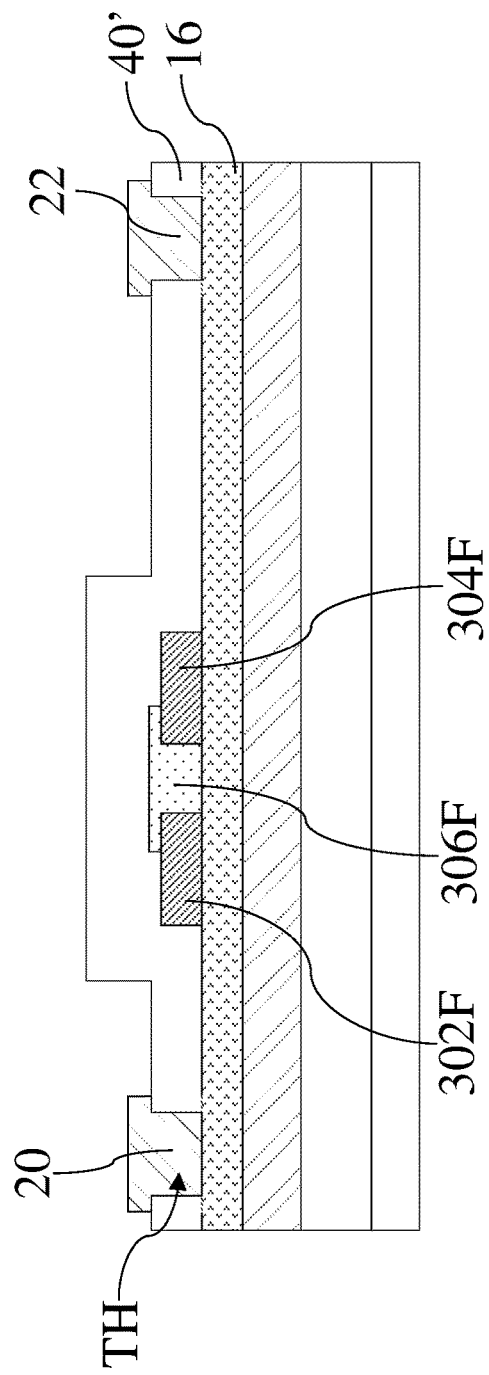

Referring to FIG. 8C, an intermediate passivation layer 40' can be formed on/over/above the nitride-based semiconductor layer 16 to cover the doped nitride-based semiconductor layers 302 and 304, and the conductive layer 306. Electrodes 20 and 22 can be formed in the through holes TH of the intermediate passivation layer 40', so as to be in contact with the nitride-based semiconductor layer 16.

Figure 8D:
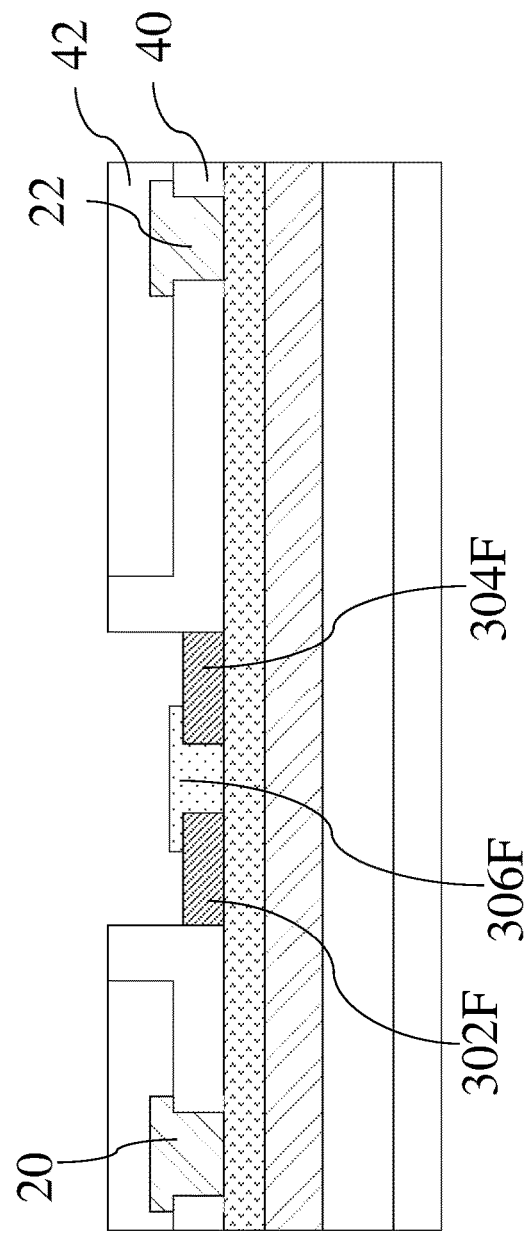

Referring to FIG. 8D, a patterning process is performed on the intermediate passivation layer 40', so as to remove the excess portions thereof, thereby forming a passivation layer 40. Thus, the doped nitride-based semiconductor layers 302F and 304F, and the conductive layer 306F are exposed. A passivation layer 42 can be formed on/over/above the electrodes 20 and 22 and the passivation layer 40.

Figures 8E, 8F:
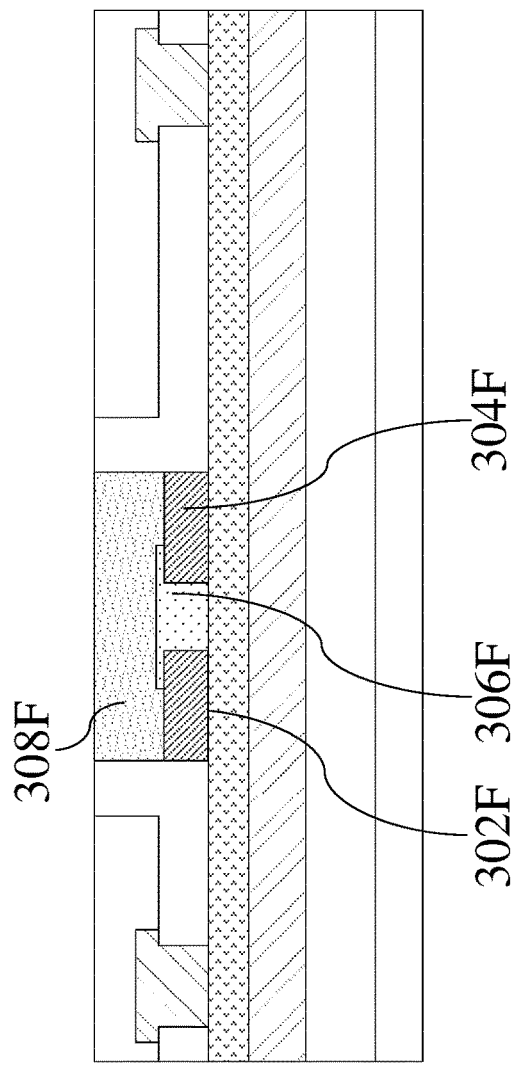

Referring to FIG. 8E, a metal layer 308F is formed to be in contact with the exposed doped nitride-based semiconductor layers 302F, 304F, and the exposed conductive layer 306F.

Referring to FIG. 8F, a passivation layer 50 can be formed on/over/above the metal layer 308F and the passivation layer 42. Thereafter, contact vias 60 and 92, and a patterned circuit layer 70 can be formed, obtaining the configuration of the semiconductor device 1F as shown in FIG. 7.

FIG. 9 is a vertical cross-sectional view of a semiconductor device 1G according to some embodiments of the present disclosure. The semiconductor device 1G is similar to the semiconductor device 1F as described and illustrated with reference to FIG. 7, except that the conductive layer 306F is replaced by a conductive layer 306G. The thickness of the conductive layer 306G can be the same as that of the thicknesses of the doped nitride-based semiconductor layers 302G and 304G.

FIG. 10 is a vertical cross-sectional view of a semiconductor device 1H according to some embodiments of the present disclosure. The semiconductor device 1H is similar to the semiconductor device 1F as described and illustrated with reference to FIG. 7, except that the conductive layer 306F is replaced by a conductive layer 306H. The thickness of the conductive layer 306H can be the less than that of the thicknesses of the doped nitride-based semiconductor layers 302H and 304H.

Figure 11:
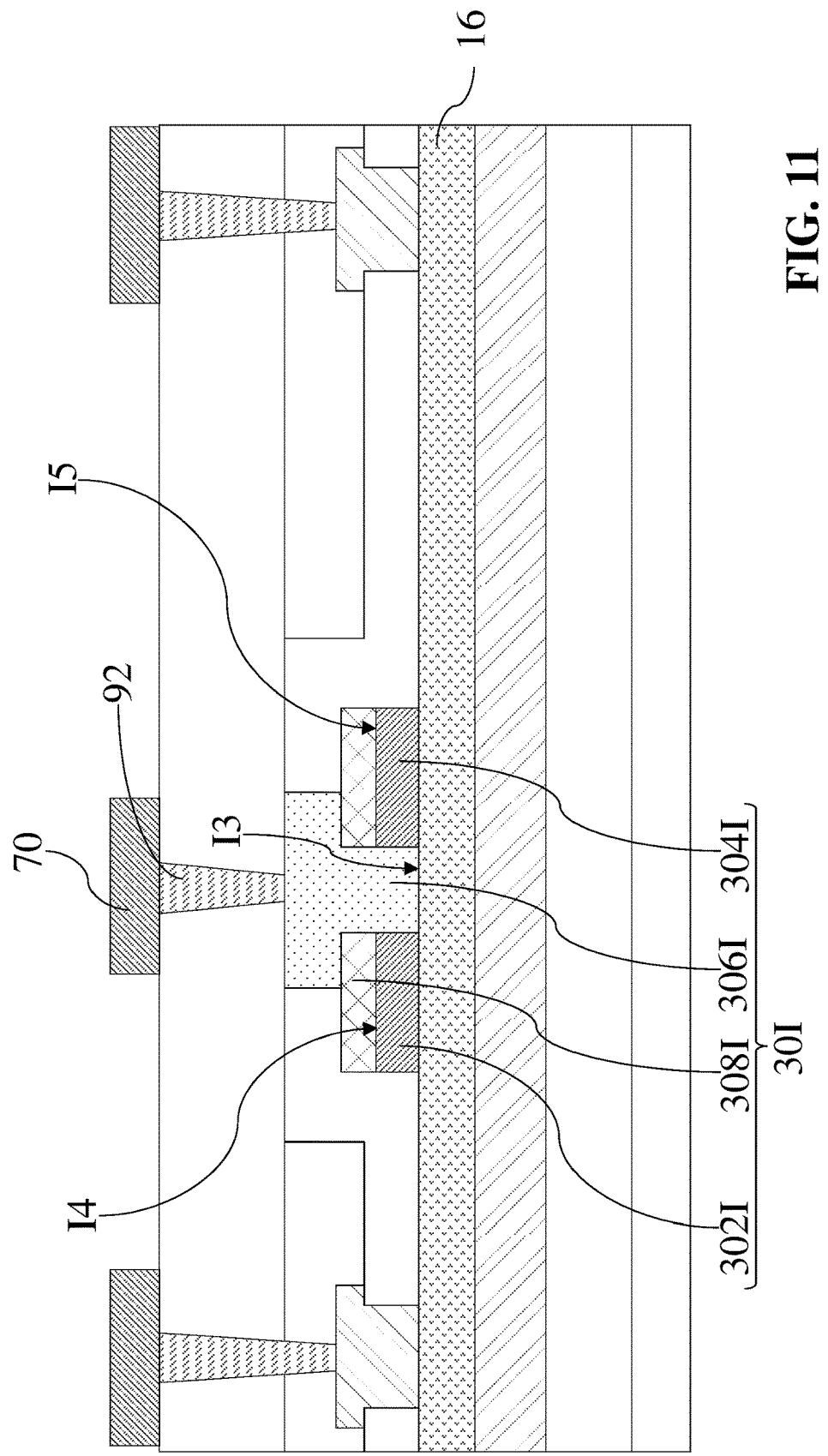
FIG. 11 is a vertical cross-sectional view of a semiconductor device according to some embodiments of the present disclosure.

FIG. 11 is a vertical cross-sectional view of a semiconductor device 1I according to some embodiments of the present disclosure. The semiconductor device 1I is similar to the semiconductor device 1F as described and illustrated with reference to FIG. 7, except that the conductive layer 306F and the metal layer 308F are replaced by a conductive layer 306I and metal layers 308I.

The metal layers 308I covers the doped nitride-based semiconductor layers 302I and 304I, respectively. The conductive layer 306I extends along side surfaces of the doped nitride-based semiconductor layers 302I and 304I, and the metal layers 308I, so as to extend downward a space/region between the doped nitride-based semiconductor layers 302I and 304I. The contact via 92 can be in contact with the conductive layer 306I and the patterned conductive layer 70.

During the manufacturing process of the semiconductor device 1I, due to different manufacturing process temperature requirements of the Schottky junction interface (e.g., room temperature) and the ohmic contact interface (e.g., high temperature), the conductive layer 306I is formed after the formation of the metal layers 308I for avoiding the negative impacts on the formed Schottky junction interface. Accordingly, the conductive layer 306I is formed at a position higher than the metal layers 308I.

In order to manufacture the semiconductor device 1I, a blanket metal layer can be formed on a blanket doped nitride-based semiconductor layer under a high temperature environment for forming the ohmic contact interfaces. Then, a patterning process is performed, so the blanket doped nitride-based semiconductor layer becomes the doped nitride-based semiconductor layers 302I and 304I; and the blanket metal layer becomes metal layers 308I. The patterning process is configured to remove excess portions of the blanket doped nitride-based semiconductor layer and the blanket metal layer, and thus at least a portion of the nitride-based semiconductor layer 16 is exposed.

Thereafter, the conductive layer 306I is formed to cover the top surfaces of the metal layers 308I. The conductive layer 306I entirely fills a space/region between the doped nitride-based semiconductor layers 302I and 304I within or under a room temperature environment, thereby forming the Schottky junction interface. As such, formed Schottky junction interface can be free from affection by the high temperature environment.

Based on the above descriptions, in the present disclosure, a conductive layer of the gate structure, which is made of metal, can extend downward a space/region between the two adjacent doped nitride-based semiconductor layers, so as to form a metal-semiconductor junction. By controlling the manufacturing process temperature of the conductive layer under a room temperature, the metal-semiconductor junction is formed to be a Schottky junction, thereby integrating the HEMT device with the Schottky diode. The Schottky diode inside the semiconductive device can promote its electrical properties; and therefore, the semiconductor device of the present disclosure can have good electrical properties.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based semiconductor device comprising:
a first nitride-based semiconductor layer;
a second nitride-based semiconductor layer disposed on the first nitride-based semiconductor layer and having a bandgap greater than a bandgap of the first nitride-based semiconductor layer;
a source electrode and a drain electrode disposed over the second nitride-based semiconductor layer; and
a gate structure disposed over the second nitride-based semiconductor layer and between the source electrode and the drain electrode, the gate structure comprising:
at least one conductive layer comprising metal in contact with the second nitride-based semiconductor layer to form a metal-semiconductor junction therebetween; and
two or more doped nitride-based semiconductor layers in contact with the second nitride-based semiconductor layer and abutting against the at least one conductive layer, so as to form contact interfaces abutting against the metal-semiconductor junction with the second nitride-based semiconductor layer;
wherein the gate structure further comprises metal layers covering the at least one conductive layer, respectively, wherein the at least one conductive layer extends along side surfaces of the two or more doped nitride-based semiconductor layers and the metal layers.

2. The nitride-based semiconductor device of claim 1, wherein the two or more doped nitride-based semiconductor layers are physically separated from each other.

3. The nitride-based semiconductor device of claim 1, wherein the at least one conductive layer has a portion in contact with the second nitride-based semiconductor layer and located between the two or more doped nitride-based semiconductor layers.

4. The nitride-based semiconductor device of claim 1, wherein the source electrode and the drain electrode are arranged along a first direction and extend along a second direction, and the two or more doped nitride-based semiconductor layers are arranged along the first direction.

5. The nitride-based semiconductor device of claim 4, wherein the two or more doped nitride-based semiconductor layers extend along the second direction.

6. The nitride-based semiconductor device of claim 1, wherein the source electrode and the drain electrode are arranged along a first direction and extend along a second direction, and the two or more doped nitride-based semiconductor layers are arranged along the second direction.

7. The nitride-based semiconductor device of claim 1, wherein the two or more doped nitride-based semiconductor layers are arranged as an array on the second nitride-based semiconductor layer, and the at least one conductive layer covers the array.

8. The nitride-based semiconductor device of claim 1, wherein the at least one conductive layer extends along side surfaces of the two or more doped nitride-based semiconductor layers to top surfaces of the two or more doped nitride-based semiconductor layers.

9. The nitride-based semiconductor device of claim 1, further comprising:
a contact via making contact with the at least one conductive layer and extending upward from the at least one conductive layer.

10. The nitride-based semiconductor device of claim 1, wherein a first doped nitride-based semiconductor layer of the two or more doped nitride-based semiconductor layers is located between the source electrode and the at least one conductive layer and has a first width, wherein a second doped nitride-based semiconductor layer of the two or more doped nitride-based semiconductor layers is located between the at least one conductive layer and the drain electrode and has a second width greater than the first width.

11. The nitride-based semiconductor device of claim 1, wherein the at least one conductive layer comprises titanium nitride.

12. A method for manufacturing a nitride-based semiconductor device, comprising:
forming a first nitride-based semiconductor layer on a substrate;
forming a second nitride-based semiconductor layer on the first nitride-based semiconductor layer;
forming two or more doped nitride-based semiconductor layers in contact with the second nitride-based semiconductor layer and physically separated from each other;

forming a conductive layer in contact with the second nitride-based semiconductor layer and the two or more doped nitride-based semiconductor layers such that the conductive layer forms a metal-semiconductor junction between the two or more doped nitride-based semiconductor layers with the second nitride-based semiconductor layer;

forming a passivation layer over the second nitride-based semiconductor layer to cover the two or more doped nitride-based semiconductor layers and the conductive layer;

forming a source electrode and a drain electrode penetrating the passivation layer to make contact with the second nitride-based semiconductor layer; and forming a gate structure disposed over the second nitride-based semiconductor layer and between the source electrode and the drain electrode; wherein the gate structure comprises metal layers covering the conductive layer, wherein the conductive layer extends along side surfaces of the two or more doped nitride-based semiconductor layers and the metal layers.

13. The method of claim 12, wherein the conductive layer is formed to entirely fill a space between the two or more doped nitride-based semiconductor layers.

14. The method of claim 12, wherein forming the two or more doped nitride-based semiconductor layers comprises:

forming a blanket doped nitride-based semiconductor layer on the second nitride-based semiconductor layer; and patterning the blanket doped nitride-based semiconductor layer to form the two or more doped nitride-based semiconductor layers having different widths.

15. The method of claim 12, further comprising:

removing a portion of the passivation layer to expose the two or more doped nitride-based semiconductor layers and the conductive layer; and forming a metal layer in contact with the exposed two or more doped nitride-based semiconductor layers and the exposed conductive layer.

16. The method of claim 12, wherein the conductive layer comprises titanium nitride.

17. A nitride-based semiconductor device comprising:

a first nitride-based semiconductor layer;

a second nitride-based semiconductor layer disposed on the first nitride-based semiconductor layer and having a bandgap greater than a bandgap of the first nitride-based semiconductor layer;

a source electrode and a drain electrode disposed over the second nitride-based semiconductor layer; and a gate structure disposed over the second nitride-based semiconductor layer and between the source electrode and the drain electrode, the gate structure comprising:

at least one conductive layer comprising metal in contact with the second nitride-based semiconductor layer to form a metal-semiconductor junction therebetween; and two or more doped nitride-based semiconductor layers in contact with the second nitride-based semiconductor layer and abutting against the at least one conductive layer, so as to form contact interfaces abutting against the metal-semiconductor junction with the second nitride-based semiconductor layer;

wherein a first doped nitride-based semiconductor layer of the two or more doped nitride-based semiconductor layers is located between the source electrode and the at least one conductive layer and has a first width, wherein a second doped nitride-based semiconductor layer of the two or more doped nitride-based semiconductor layers is located between the at least one conductive layer and the drain electrode and has a second width greater than the first width.

18. The nitride-based semiconductor device of claim 17, wherein the gate structure further comprises a metal layer covering the at least one conductive layer and the two or more doped nitride-based semiconductor layers to make contact with the at least one conductive layer and the two or more doped nitride-based semiconductor layers.

19. The nitride-based semiconductor device of claim 18, wherein the at least one conductive layer has a top surface in a position higher than top surfaces of the two or more doped nitride-based semiconductor layers, and the metal layer directly covers the top surfaces of the at least one conductive layer and the two or more doped nitride-based semiconductor layers.

20. The nitride-based semiconductor device of claim 18, further comprising:

a contact via making contact with the metal layer and extending upward from the metal layer, wherein the contact via is electrically coupled with the at least one conductive layer through the metal layer.

* * * * *